United States Patent
Kwon et al.

(10) Patent No.: US 7,870,678 B2
(45) Date of Patent: Jan. 18, 2011

(54) HYBRID SENSOR MODULE AND SENSING METHOD USING THE SAME

(75) Inventors: Oh Jo Kwon, Suwon (KR); Won Tae Choi, Yongin (KR); Kyoung Soo Kwon, Yongin (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 553 days.

(21) Appl. No.: 11/896,908

(22) Filed: Sep. 6, 2007

(65) Prior Publication Data

US 2008/0052931 A1 Mar. 6, 2008

(30) Foreign Application Priority Data

Sep. 6, 2006 (KR) .................. 10-2006-0085613

(51) Int. Cl.
*G01C 17/00* (2006.01)
(52) U.S. Cl. ..................... 33/355 R; 33/356
(58) Field of Classification Search ............. 33/356, 33/355 R, 361
See application file for complete search history.

(56) References Cited

U.S. PATENT DOCUMENTS

| | | | |
|---|---|---|---|
| 6,877,237 B1 * | 4/2005 | Withanawasam | 33/356 |
| 7,119,533 B2 * | 10/2006 | Tamura et al. | 324/202 |
| 7,126,330 B2 * | 10/2006 | Peczalski et al. | 324/247 |
| 7,149,627 B2 * | 12/2006 | Ockerse et al. | 701/224 |
| 7,266,452 B2 * | 9/2007 | Ockerse et al. | 701/224 |
| 7,298,140 B2 * | 11/2007 | Honkura et al. | 324/249 |
| 7,379,814 B2 * | 5/2008 | Ockerse et al. | 701/224 |
| 7,509,748 B2 * | 3/2009 | Xue et al. | 33/356 |
| 7,581,326 B1 * | 9/2009 | Bulow et al. | 33/355 R |
| 2003/0167121 A1 * | 9/2003 | Ockerse et al. | 701/224 |
| 2005/0242805 A1 * | 11/2005 | Honkura et al. | 324/249 |
| 2006/0066295 A1 * | 3/2006 | Tamura et al. | 324/202 |
| 2007/0288166 A1 * | 12/2007 | Ockerse et al. | 701/224 |
| 2008/0052932 A1 * | 3/2008 | Xue et al. | 33/356 |

FOREIGN PATENT DOCUMENTS

| | | |
|---|---|---|
| JP | 2002-243441 | 8/2002 |
| JP | 2004-264053 | 9/2004 |
| JP | 2005-249554 | 9/2005 |

OTHER PUBLICATIONS

Japanese Office Action issued on Sep. 29, 2009 in corresponding Japanese Patent Application 2007-232008.

* cited by examiner

*Primary Examiner*—Yaritza Guadalupe-McCall

(57) ABSTRACT

Provided is a hybrid sensor module including first and second sensors that are attached on one surface of a printed circuit board (PCB) so as to detect two-axis signal components parallel to the PCB; a third sensor that is attached on one surface of the PCB such that the axial direction of the third sensor is tilted at a predetermined angle from a vertical direction of the PCB, the third sensor detecting a signal component sensed in the axial direction; and a signal correction unit that is connected to the first to third sensor and corrects signal components, detected from the respective sensors, into signal components of an orthogonal coordinate system.

4 Claims, 3 Drawing Sheets

HYBRID SENSOR MODULE AND SENSING METHOD USING THE SAME

CROSS-REFERENCE TO RELATED APPLICATIONS

This application claims the benefit of Korean Patent Application No. 10-2006-0085613 filed with the Korea Intellectual Property Office on Sep. 6, 2006, the disclosure of which is incorporated herein by reference.

BACKGROUND OF THE INVENTION

1. Field of the Invention

The present invention relates to a hybrid sensor module, of which the overall height can be reduced, while a reduction in characteristic of the sensor module caused by the reduction in sensor size is prevented, and a sensing method using the same.

2. Description of the Related Art

In general, sensor modules serve to detect a signal component like a vector with a magnitude and direction on a two- or three-dimensional space. As for representative sensor modules, there are provided a geomagnetic sensor which detects the magnitude of the geomagnetic field existing on the three-dimensional space and an acceleration sensor which measures acceleration.

In particular, two-axis sensors are needed for detecting signal components existing on the two-dimensional space. When the two-axis sensors are operated in a state where they are placed in parallel to the surface of the earth, signal components output from two axes, that is, X and Y axes can be detected. Such signal components can be expressed by a sum of vectors with a magnitude and direction.

When the two-axis sensors are used, only the X- and Y-axis components of a vector can be measured. However, three-dimensional components should be all measured to detect a perfect signal. In order to measure a signal on the three-dimensional space, three sensors should be vertically arranged in such a manner that the respective sensor axes measure vector components of the signal. For this, three sensors having the same sensitivity should be arranged in parallel to the X, Y, and Z axes of an orthogonal coordinate system, respectively. In this structure, signal components existing on the three-dimensional space can be measured and then expressed as X-, Y-, and Z-axis components of the orthogonal coordinate system.

Currently, as for sensors used in mobile equipments, two-axis sensor modules are mainly adopted. This is because mobile equipments do not have such a sufficient space as to mount a three-axis sensor module. In the two-axis sensor module, two sensors are arranged vertically with each other on the X and Y planes. As for the two-axis sensor module, there are provided various types of sensors such as a fluxgate sensor, a magneto-resistance (MR) sensor, a magneto-impedance (MI) sensor and the like. In these sensors, however, three sensors cannot be implemented as one device. Therefore, a module is constructed in a hybrid-sensor type so as to implement a three-axis sensor module.

In the hybrid-sensor type module, the same kind of sensors are adopted on two axes, and a different kind of sensor is adopted on the other one axis. Then, it is possible to solve a problem occurring when a three-axis sensor module is implemented. For example, when a geomagnetic sensor is manufactured using the Micro Electro Mechanical Systems (MEMS) technique, X- and Y-axis sensors can be easily implemented on a silicon substrate. However, there are technical difficulties in implementing a Z-axis sensor. Further, although the Z-axis sensor is implemented, the characteristic thereof is considerably reduced, compared with those of the other two sensors. Furthermore, when three sensors are implemented as one device, the height of the device is increased. Therefore, it is difficult to adopt the device into mobile equipments.

As for a device for solving such a problem, a hybrid sensor module attracts attention. When three sensors with the same size are arranged to construct a three-axis sensor module, the Z-axis height of the sensor module makes it difficult to commonly use the sensor module. Therefore, as for the X- and Y-axis sensors, fluxgate-type sensors are adopted. As for the Z-axis sensor, an MR sensor or hall sensor is used so as to reduce the Z-axis height.

Meanwhile, a sensor expresses a signal component, existing on the three-dimensional space, as a sum of vectors with a magnitude and direction. Therefore, a direction where the sensor is disposed should coincide with a direction where the sensor actually senses the signal component.

FIG. 1 is a diagram showing X-, Y-, and Z-axis sensors constructed along a general orthogonal coordinate system. FIGS. 2A and 2B are diagrams showing conventional sensor modules, in which X-, Y-, and Z-axis sensors 22, 23, and 24 are arranged in parallel to the orthogonal coordinate system.

FIG. 2A shows a sensor module to which the sensors of FIG. 1 are applied. In the sensor module, the X-, Y-, and Z-axis sensors with a predetermined size l are arranged. FIG. 2B shows a hybrid sensor module in which the size of the Z-axis sensor is reduced in such a manner that the height of the Z-axis sensor decreases to a height l'.

As shown in FIGS. 2A and 2B, the conventional sensor module includes the X-, Y-, and Z-axis sensors 22, 23, and 24, which are attached on a printed circuit board (PCB) 21 so as to detect signal components existing on the three-dimensional space, and a signal processing circuit 25 which receives the detected signal components through a signal line connected to the respective sensors 22, 23, and 24 and then processes the signal components.

In FIGS. 2A and 2B, arrows indicate sensing directions of the respective sensors.

The sensor module having the X-, Y-, and Z-axis sensors arranged as shown in FIG. 2A has a relatively excellent sensor characteristic (for example, sensitivity), because the X-, Y-, and Z-axis sensors have a predetermined length l such that a certain sensor characteristic can be maintained. Because of the size of the sensors, or specifically, the size of the Z-axis sensor 24, the overall height of the sensor module increases. Therefore, it is difficult to apply the sensor module to mobile equipments which are gradually reduced in size.

To solve such a problem, the hybrid sensor module shown in FIG. 2B, in which the Z-axis sensor is smaller than the X- and Y-axis sensors 22 and 23, is frequently used. However, as the size of the sensor decreases, the characteristic thereof is considerably degraded. Therefore, the characteristic of the Z-axis sensor 24 of FIG. 2B is considerably degraded, compared with the other sensors. As a result, the overall characteristic of the sensor module is degraded.

SUMMARY OF THE INVENTION

An advantage of the present invention is that it provides a hybrid sensor module and a sensing method using the same, in which a certain sensor axis of an orthogonal coordinate system is tilted at a predetermined angle such that the overall height of the hybrid sensor module can be reduced. Accordingly, a sensor size does not need to be reduced, in order to reduce the height of the sensor module. Then, it is possible to prevent a reduction in characteristic of the sensor module which is caused by the reduction in sensor size.

Another advantage of the invention is that it provides a hybrid sensor module and a sensing method, in which signal components detected by a tilted sensor can be corrected into signal components of an orthogonal coordinate system by a simple equation such that the same sensor characteristic as on the orthogonal coordinate system can be maintained.

Additional aspects and advantages of the present general inventive concept will be set forth in part in the description which follows and, in part, will be obvious from the description, or may be learned by practice of the general inventive concept.

According to an aspect of the invention, a hybrid sensor module comprises first and second sensors that are attached on one surface of a printed circuit board (PCB) so as to detect two-axis signal components parallel to the PCB; a third sensor that is attached on one surface of the PCB such that the axial direction of the third sensor is tilted at a predetermined angle from a vertical direction of the PCB, the third sensor detecting a signal component sensed in the axial direction; and a signal correction unit that is connected to the first to third sensor and corrects signal components, detected from the respective sensors, into signal components of an orthogonal coordinate system.

The axial direction of the third sensor is tilted in a direction where the first sensor may be positioned.

The signal correction unit may correct the signal components, detected from the respective sensors, into signal components of the orthogonal coordinate system by using the following equation:

$$\begin{bmatrix} X' \\ Y' \\ Z' \end{bmatrix} = \begin{bmatrix} \cos\theta & 0 & -\sin\theta \\ 0 & 1 & 0 \\ \sin\theta & 0 & \cos\theta \end{bmatrix} \begin{bmatrix} X \\ Y \\ Z \end{bmatrix},$$

where X', Y', and Z' mean signal components detected from the respective sensors, X, Y, and Z mean signal components of the orthogonal coordinate system, and θ means an angle at which the third sensor is tilted.

The axial direction of the third sensor is tilted in a direction where the second sensor may be positioned.

The signal correction unit may correct the signal components, detected from the respective sensors, into signal components of the orthogonal coordinate system by using the following equation:

$$\begin{bmatrix} X' \\ Y' \\ Z' \end{bmatrix} = \begin{bmatrix} 1 & 0 & 0 \\ 0 & \cos\phi & \sin\phi \\ 0 & -\sin\phi & \cos\phi \end{bmatrix} \begin{bmatrix} X \\ Y \\ Z \end{bmatrix},$$

where X', Y', and Z' mean signal components detected from the respective sensors, X, Y, and Z mean signal components of the orthogonal coordinate system, and φ means an angle at which the third sensor is tilted.

The first to third sensors have a sensor size more than a predetermined size, the first to third sensors having the same sensor size.

According to another aspect of the invention, a sensing method using a hybrid sensor module, the sensing method comprises the steps of: (a) detecting signal components sensed from first and second sensors, which are disposed in parallel to a PCB, and a third sensor of which the axial direction is tilted at a predetermined angle from a vertical direction of the PCB; and (b) correcting the signal components detected at step (a) into signal components of an orthogonal coordinate system.

At step (a), the axial direction of the third sensor may be tilted in a direction where the first sensor is positioned.

At step (b), the signal components detected at step (a) are corrected into signal components of the orthogonal coordinate system by using the following equation:

$$\begin{bmatrix} X' \\ Y' \\ Z' \end{bmatrix} = \begin{bmatrix} \cos\theta & 0 & -\sin\theta \\ 0 & 1 & 0 \\ \sin\theta & 0 & \cos\theta \end{bmatrix} \begin{bmatrix} X \\ Y \\ Z \end{bmatrix},$$

where X', Y', and Z' mean signal components detected from the respective sensors, X, Y, and Z mean signal components of the orthogonal coordinate system, and θ means an angle at which the third sensor is tilted.

At step (a), the axial direction of the third sensor may be tilted in a direction where the second sensor is positioned.

At step (b), the signal components detected at step (a) are corrected into signal components of the orthogonal coordinate system by using the following equation:

$$\begin{bmatrix} X' \\ Y' \\ Z' \end{bmatrix} = \begin{bmatrix} 1 & 0 & 0 \\ 0 & \cos\phi & \sin\phi \\ 0 & -\sin\phi & \cos\phi \end{bmatrix} \begin{bmatrix} X \\ Y \\ Z \end{bmatrix},$$

where X', Y', and Z' mean signal components detected from the respective sensors, X, Y, and Z mean signal components of the orthogonal coordinate system, and φ means an angle at which the third sensor is tilted.

The first to third sensors have a sensor size more than a predetermined size, the first to third sensors having the same sensor size.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which.

DETAILED DESCRIPTION OF THE PREFERRED EMBODIMENTS

Figure 1:
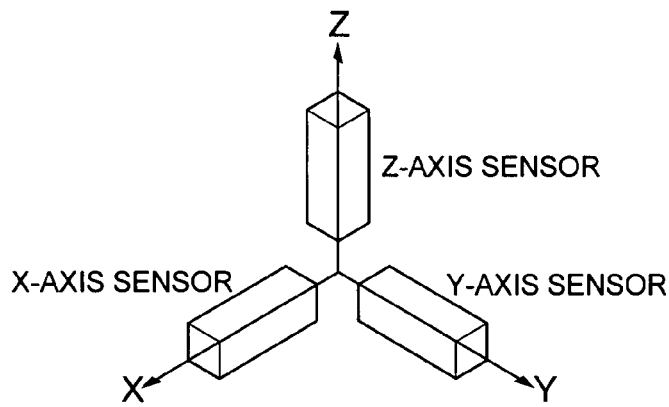
FIG. 1 is a diagram showing X-, Y-, and Z-axis sensors constructed along a general orthogonal coordinate system.

Reference will now be made in detail to the embodiments of the present general inventive concept, examples of which are illustrated in the accompanying drawings, wherein like reference numerals refer to like elements throughout. The embodiments are described below in order to explain the present general inventive concept by referring to the figures.

Hereinafter, preferred embodiments of the present invention will be described in detail with reference to the accompanying drawings.

Hybrid Sensor Module

Figure 3:
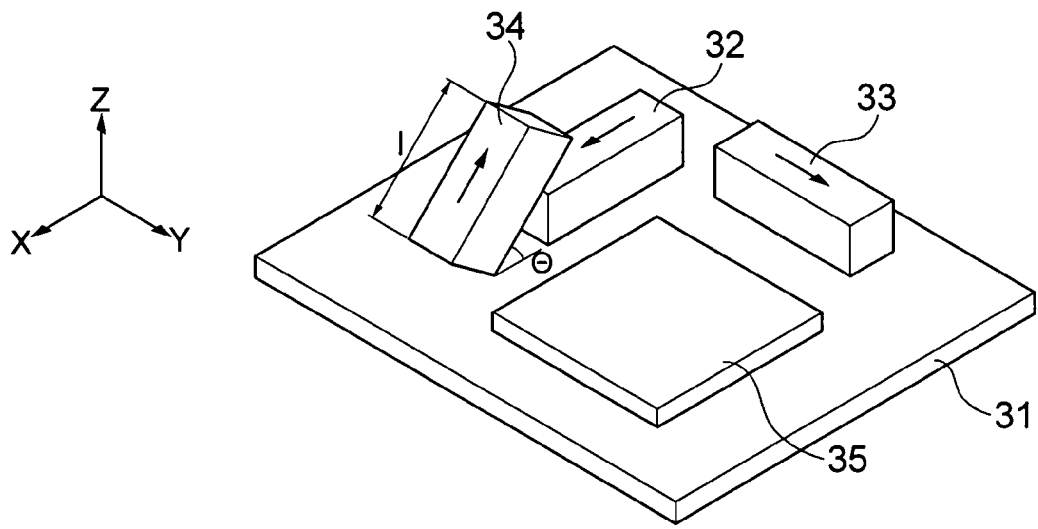
FIG. 3 is a diagram showing the construction of a hybrid sensor module according to the invention.

FIG. 3 is a diagram showing the construction of a hybrid sensor module according to the invention. As shown in FIG. 3, the hybrid sensor module includes first to third sensors 32 to 34 and a signal correction unit 35.

Figure 2A:
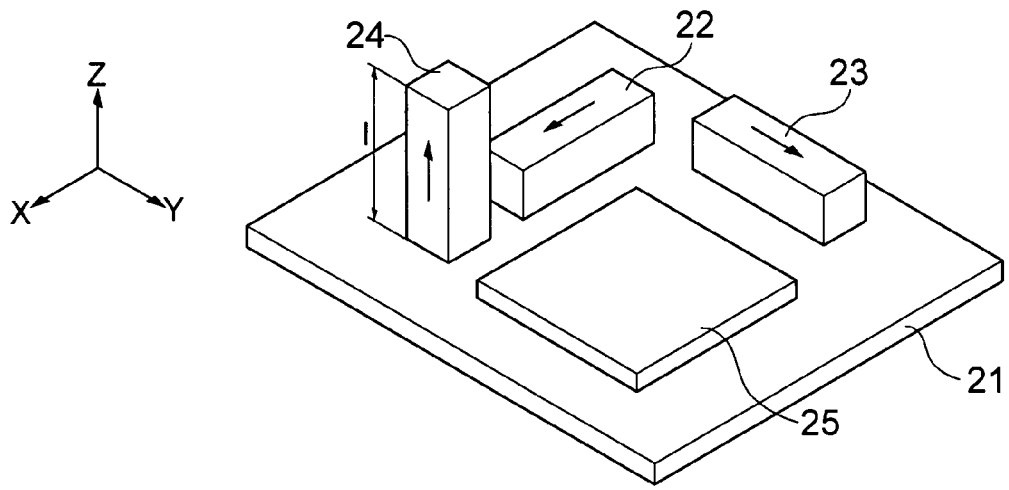
FIGS. 2A and 2B are diagrams showing conventional sensor modules.
Figure 2B:
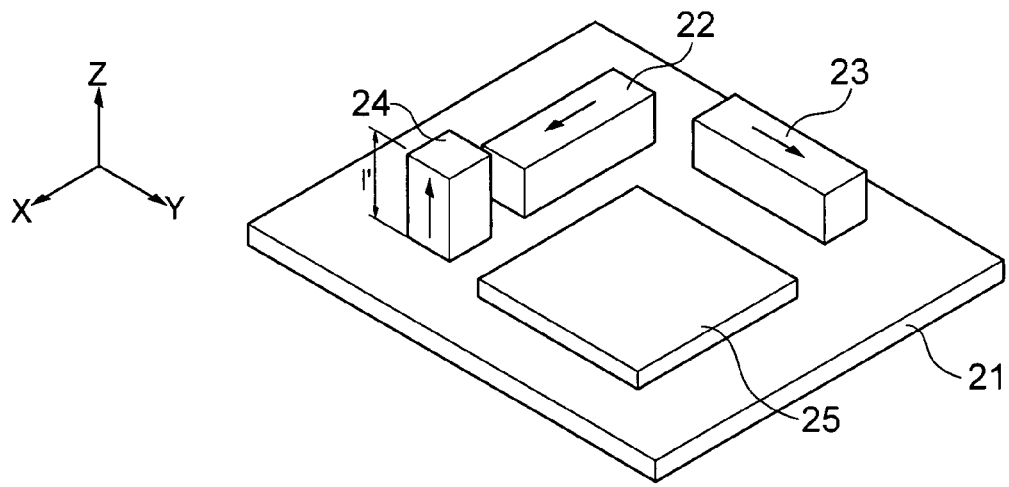

The first to third sensors 32 to 34 respectively have a sensor size l more than a predetermined size. Further, the first to third sensors 32 to 34 have the same sensor size. Accordingly, the hybrid sensor module can have a relatively excellent sensor characteristic like the conventional sensor module shown in FIG. 2A.

The first and second sensors 32 and 33 are attached on one surface of a PCB 31 so as to detect two-axis signal components parallel to the PCB 31.

The third sensor 34 is attached on one surface of the PCB 31 such that an axial direction of the third sensor 34 is tilted at a predetermined angle θ from the vertical direction of the PCB 31, that is, the Z-axis direction of an orthogonal coordinate system. The third sensor 34 detects a signal component sensed in the axial direction.

At this time, the axial direction of the third sensor 34 may be tilted in a direction where the first sensor 32 is positioned, that is, in the X-axis direction of the orthogonal coordinate system or may be tilted in a direction where the second sensor 33 is positioned, that is, in the Y-axis direction of the orthogonal coordinate system. In addition, the axial direction may be tilted in various directions such that application can be achieved in various manners. In this case, the tilted angle can be represented by a plus (+) or minus (−) direction. Hereinafter, when the axial direction of the third sensor 34 is tilted in the X or Y direction of the orthogonal coordinate system, the tilted angle is represented by the plus (+) direction.

The following descriptions are focused on a case where the axial direction of the third sensor 34 is tilted in the X-axis direction of the orthogonal coordinate system and a case where the axial direction is tilted in the Y-axis direction of the orthogonal coordinate system. However, this is only for convenience of description. The present invention is not limited to the two cases, but can be applied to a case where the axial direction is tilted in another direction.

Figure 4:
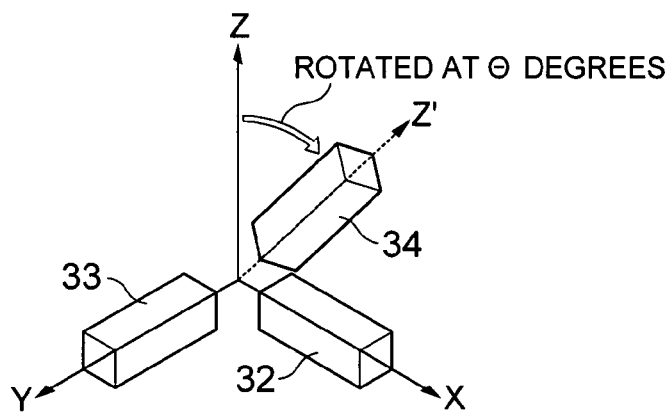
FIGS. 4 and 5 are diagrams for explaining a case where the axial direction of a third sensor is tilted in the X-axis direction of an orthogonal coordinate system.
Figure 5:
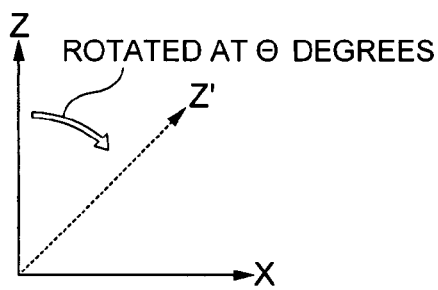

FIGS. 4 and 5 are diagrams for explaining a case where the axial direction of the third sensor is tilted in the X-axis direction of the orthogonal coordinate system. FIG. 4 is a diagram showing the third sensor formed in a position where the Z axis of the orthogonal coordinate system is rotated at a predetermined angle about the Y axis of the orthogonal coordinate system, and FIG. 5 is a diagram showing the axial direction of the third sensor.

When the Z axis of the orthogonal coordinate system is rotated at a predetermined angle θ about the Y axis of the orthogonal coordinate system as shown in FIG. 4, the axial direction Z' of the third sensor 34 is tilted at the predetermined angle θ in the X-axis direction from the Z-axis direction of the orthogonal coordinate system, that is, in the direction where the first sensor 32 is positioned, as shown in FIG. 5.

Figure 6:
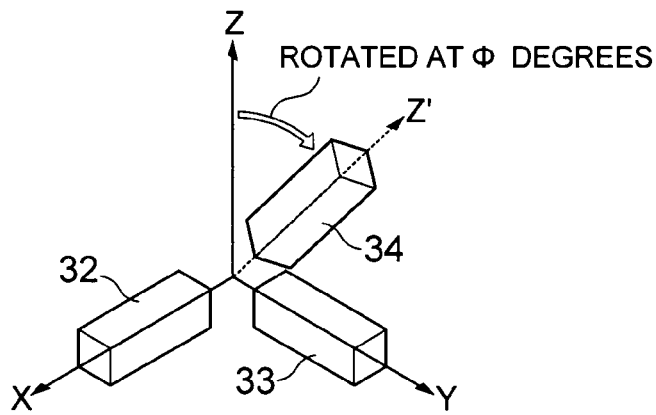
FIGS. 6 and 7 are diagrams for explaining a case where the axial direction of the third sensor is tilted in the Y-axis direction of the orthogonal coordinate system.
Figure 7:
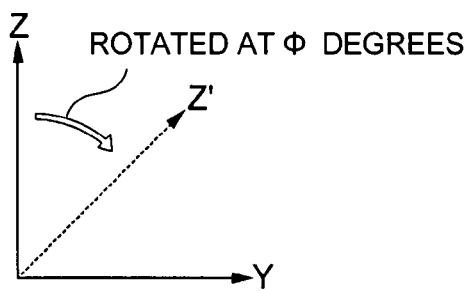

Meanwhile, FIGS. 6 and 7 are diagrams for explaining a case where the axial direction of the third sensor is tilted in the Y-axis direction of the orthogonal coordinate system. FIG. 6 is a diagram showing the third sensor formed in a position where the Z axis of the orthogonal coordinate system is rotated at a predetermined angle about the X axis of the orthogonal coordinate system. FIG. 7 is a diagram showing the axial direction of the third sensor.

When the Z axis of the orthogonal coordinate system is rotated at a predetermined angle ϕ about the X axis of the orthogonal coordinate system as shown in FIG. 6, the axial direction Z' of the third sensor 34 is tilted at the predetermined angle ϕ in the Y-axis direction from the Z-axis direction of the orthogonal coordinate system, that is, in the direction where the second sensor 33 is positioned, as shown in FIG. 7.

As such, when the Z axis of the orthogonal coordinate system is tilted at the predetermined angle θ or ϕ in the X- or Y-axis direction of the orthogonal coordinate system, the height of the third sensor 34 can be calculated by Equation 1.

Height of third sensor=Z-axis height at orthogonal coordinate system×cos θ{or cos ϕ}  [Equation 1]

As described in Equation 1, when the Z axis of the orthogonal coordinate system is tilted at a predetermined angle, the overall height of the sensor module can be reduced. That is, when the Z axis of the orthogonal coordinate system is tilted at 45 degrees in the X- or Y-axis direction of the orthogonal coordinate system, the height of the third sensor is reduced by 30%, compared with the Z-axis height of the orthogonal coordinate system. Accordingly, the overall height of the sensor module is also reduced, which makes it possible to apply the sensor module to mobile equipments which are gradually reduced in size.

Further, since the overall height of the sensor module can be reduced by tilting the Z axis of the orthogonal coordinate system at a predetermined angle, the sensor size does not need to be reduced. Accordingly, it is possible to prevent a reduction in characteristic of the sensor module, which is caused by the reduction in sensor size.

However, since the axial direction of the third sensor 34 is tilted in the X- or Y-axis direction of the orthogonal coordinate system, the first to third sensors 32 to 34 are not arranged in parallel to the orthogonal coordinate system. Therefore, signal components detected by the first to third sensors 32 to 34 need to be corrected into signal components of the orthogonal coordinate system. Such a process is performed by the signal correction unit 35.

As described above, the signal correction unit 35 is connected to the first to third sensors 32 to 34 and serves to correct signal components, detected by the respective sensors, into signal components of the orthogonal coordinate system. An equation required for the correction process is expressed by Equation 2.

$$\begin{bmatrix} X' \\ Y' \\ Z' \end{bmatrix} = Rxyz(d) \begin{bmatrix} X \\ Y \\ Z \end{bmatrix} \quad \text{[Equation 2]}$$

Here, Equation 2 shows that when the orthogonal coordinate system XYZ is rotated by d degrees about any one axis, it is converted into an X'Y'Z' coordinate system. The X'Y'Z' coordinate system means the signal components detected from the respective sensors of the invention.

In this case, Rxyz(d) is a determinant required for the correction process, which can be specifically expressed by Equations 3 to 5.

$$Rx(\phi) = \begin{bmatrix} 1 & 0 & 0 \\ 0 & \cos\phi & \sin\phi \\ 0 & -\sin\phi & \cos\phi \end{bmatrix} \quad \text{[Equation 3]}$$

$$Ry(\theta) = \begin{bmatrix} \cos\theta & 0 & -\sin\theta \\ 0 & 1 & 0 \\ \sin\theta & 0 & \cos\theta \end{bmatrix} \quad \text{[Equation 4]}$$

-continued $$Rz(\psi) = \begin{bmatrix} \cos\psi & \sin\psi & 0 \\ -\sin\psi & \cos\psi & 0 \\ 0 & 0 & 1 \end{bmatrix}$$ [Equation 5]

Here, Equation 3 is a determinant required when the orthogonal coordinate system XYZ is rotated at a predetermined angle φ about the X axis of the orthogonal coordinate system, Equation 4 is a determinant required when the orthogonal coordinate system XYZ is rotated at a predetermined angle θ about the Y axis of the orthogonal coordinate system, and Equation 5 is a determinant required when the orthogonal coordinate system XYZ is rotated at a predetermined angle ψ about the Z axis of the orthogonal coordinate system.

Through Equations 2 to 5, the signal correction unit 35 corrects signal components, detected from the respective sensors 32, 33, and 34, into signal components of the orthogonal coordinate system. As shown in FIGS. 4 and 5, when the third sensor 34 is formed in a position where the Z axis of the orthogonal coordinate system is rotated at a predetermined angle θ about the Y axis of the orthogonal system, that is, when the axial direction of the third sensor 34 is tilted at a predetermined angle θ in the X-axis direction of the orthogonal coordinate system, the signal components can be corrected through Equation 6 using Equations 2 and 4.

$$\begin{bmatrix} X' \\ Y' \\ Z' \end{bmatrix} = \begin{bmatrix} \cos\theta & 0 & -\sin\theta \\ 0 & 1 & 0 \\ \sin\theta & 0 & \cos\theta \end{bmatrix} \begin{bmatrix} X \\ Y \\ Z \end{bmatrix}$$ [Equation 6]

Here, X', Y', and Z' mean signal components detected from the respective sensors 32, 33, and 34, X, Y, and Z mean signal components of the orthogonal coordinate system, and θ means an angle at which the third sensor 34 is tilted.

In addition, a process in which the signal components detected from the respective sensors 32, 33, and 34 are corrected into signal components of the orthogonal coordinate system through Equation 6, or specifically, a process in which a signal component Z' detected from the third sensor 34 which is not parallel to the Z axis of the orthogonal coordinate system is corrected into a Z-axis signal component Z of the orthogonal coordinate system can be explained through Equations 7 and 8.

$$Z' = X \times \sin\theta + Z \times \cos\theta$$ [Equation 7]

$$Z = \frac{Z' - X \times \sin\theta}{\cos\theta}$$ [Equation 8]

That is, when the determinant of Equation 6 is computed, the signal component Z' detected by the third sensor 34 can be represented by Equation 7. Further, the Z-axis signal component Z of the orthogonal coordinate system can be simply obtained through Equation 8 using Equation 7.

Meanwhile, when the sensor 34 is formed in a position where the Z axis of the orthogonal coordinate system is rotated at a predetermined angle φ about the X axis of the orthogonal coordinate system as shown in FIGS. 6 and 7, that is, when the axial direction of the third sensor 34 is tilted at a predetermined angle φ in the Y-axis direction of the orthogonal coordinate system, the signal correction unit 35 can perform correction though Equation 9 using Equations 2 and 3.

$$\begin{bmatrix} X' \\ Y' \\ Z' \end{bmatrix} = \begin{bmatrix} 1 & 0 & 0 \\ 0 & \cos\phi & \sin\phi \\ 0 & -\sin\phi & \cos\phi \end{bmatrix} \begin{bmatrix} X \\ Y \\ Z \end{bmatrix}$$ [Equation 9]

Here, X', Y', and Z' mean signal components detected from the respective sensors 32, 33, and 34, X, Y, and Z mean signal components of the orthogonal coordinate system, and φ means an angle at which the third sensor 34 is tilted.

In addition, a process in which a signal component Z' detected from the third sensor 34 which is not parallel to the Z axis of the orthogonal coordinate system is corrected into a Z-axis signal component Z of the orthogonal coordinate system through Equation 9 can be explained through Equations 10 and 11.

$$Z' = -Y \times \sin\phi + Z \times \cos\phi$$ [Equation 10]

$$Z = \frac{Z' + Y \times \sin\phi}{\cos\phi}$$ [Equation 11]

That is, when the determinant of Equation 9 is computed, the signal component Z' detected from the third sensor 34 can be represented by Equation 10. Further, the Z-axis signal component Z of the orthogonal coordinate system can be simply calculated by Equation 11 using Equation 10.

Sensing Method Using Hybrid Sensor Module

Figure 8:
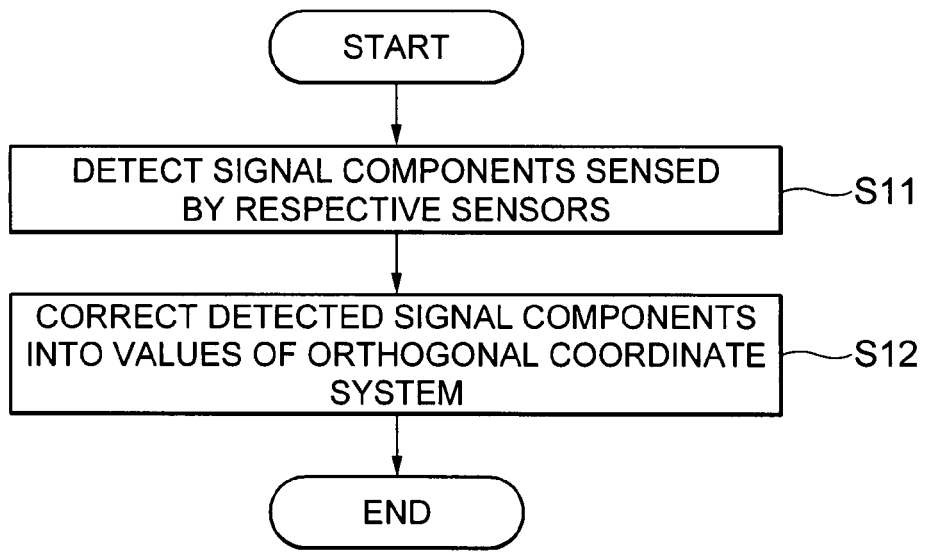
FIG. 8 is a flow chart showing a sensing method using a hybrid sensor module according to the invention.

FIG. 8 is a flow chart showing a sensing method using the hybrid sensor module according to the invention. As shown in FIG. 8, the sensing method can be roughly divided into two steps.

First, signal components sensed from the first to third sensors are detected (step S11). In this case, the first and second sensors are disposed in parallel to the PCB, and the third sensor is disposed in such a manner that the axial direction thereof is tilted at a predetermined angle from the Z-axis direction of the orthogonal coordinate system.

The first to third sensors have a sensor size more than a predetermined size. Further, the first to third sensors have the same sensor size. Therefore, it is possible to prevent a reduction in sensor characteristic which is caused by the reduction in sensor size.

At step S11, the axial direction of the third sensor may be tilted in a direction where the first sensor is positioned, that is, in the X-axis direction of the orthogonal coordinate system. Alternately, the axial direction of the third sensor may be tilted in a direction where the second sensor is positioned, that is, in the Y-axis direction of the orthogonal coordinate system. In addition, the axial direction may be tilted in various directions such that application can be carried out in various manners.

Finally, the signal components detected in step S11 are corrected into signal components of the orthogonal coordinate system (step S12).

At this time, when the axial direction of the third sensor used at step S11 is tilted in the X-axis direction of the orthogonal coordinate system, the signal components detected at step S11 are corrected into signal components of the orthogonal coordinate system by using Equation 6. Further, when the axial direction of the third sensor used at step S11 is tilted in the Y-axis direction of the orthogonal coordinate system, the signal components detected at step S11 are corrected into signal components of the orthogonal coordinate system by using Equation 9.

According to the hybrid sensor module and the sensing method using the same, a predetermined sensor axis of the orthogonal coordinate system is tilted at a predetermined angle such that the overall height of the sensor module can be reduced. Accordingly, a sensor size does not need to be reduced, in order to reduce the height of the sensor module. Further, it is possible to prevent a reduction in characteristic of the sensor module, which is caused by the reduction in sensor size.

Further, a signal component detected by the tilted sensor can be corrected into a signal component of the orthogonal coordinate system by using a simple equation. Therefore, it is possible to maintain the same sensor characteristic as on the orthogonal coordinate system.

That is, while a reduction in characteristic of the sensor module, caused by the reduction in sensor size, is prevented, the overall height of the sensor is reduced, which makes it easy to apply the sensor module to mobile equipments and the like.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A hybrid sensor module comprising:
   first and second sensors that are attached on one surface of a printed circuit board (PCB) so as to detect two-axis signal components parallel to the PCB;
   a third sensor that is attached on one surface of the PCB such that the axial direction of the third sensor is tilted at a predetermined angle $\theta$ from a vertical direction of the PCB in a direction where the first sensor is positioned, the third sensor detecting a signal component sensed in the axial direction; and
   a signal correction unit that is connected to the first, the second, and the third sensors and corrects signal components, detected from the respective sensors, into signal components of an orthogonal coordinate system by using the following equation:
   $$\begin{bmatrix} X' \\ Y' \\ Z' \end{bmatrix} = \begin{bmatrix} \cos\theta & 0 & -\sin\theta \\ 0 & 1 & 0 \\ \sin\theta & 0 & \cos\theta \end{bmatrix} \begin{bmatrix} X \\ Y \\ Z \end{bmatrix},$$
   where X', Y', and Z' mean signal components detected from the respective sensors, X, Y, and Z mean signal components of the orthogonal coordinate system, and $\theta$ means the angle at which the third sensor is tilted.

2. A hybrid sensor module comprising:
   first and second sensors that are attached on one surface of a printed circuit board (PCB) so as to detect two-axis signal components parallel to the PCB;
   a third sensor that is attached on one surface of the PCB such that the axial direction of the third sensor is tilted at a predetermined angle $\phi$ from a vertical direction of the PCB in a direction where the second sensor is positioned, the third sensor detecting a signal component sensed in the axial direction; and
   a signal correction unit that is connected to the first, the second, and the third sensors and corrects signal components, detected from the respective sensors, into signal components of an orthogonal coordinate system by using the following equation:
   $$\begin{bmatrix} X' \\ Y' \\ Z' \end{bmatrix} = \begin{bmatrix} 1 & 0 & 0 \\ 0 & \cos\phi & \sin\phi \\ 0 & -\sin\phi & \cos\phi \end{bmatrix} \begin{bmatrix} X \\ Y \\ Z \end{bmatrix},$$
   where X', Y', and Z' mean signal components detected from the respective sensors, X, Y, and Z mean signal components of the orthogonal coordinate system, and $\phi$ means the angle at which the third sensor is tilted.

3. A sensing method using a hybrid sensor module, the sensing method comprising:
   detecting signal components sensed from first and second sensors, which are disposed in parallel to a PCB, and a third sensor of which the axial direction is tilted at a predetermined angle $\theta$ from a vertical direction of the PCB in a direction where the first sensor is positioned; and
   correcting the signal components detected at the detecting signal components into signal components of an orthogonal coordinate system by using the following equation:
   $$\begin{bmatrix} X' \\ Y' \\ Z' \end{bmatrix} = \begin{bmatrix} \cos\theta & 0 & -\sin\theta \\ 0 & 1 & 0 \\ \sin\theta & 0 & \cos\theta \end{bmatrix} \begin{bmatrix} X \\ Y \\ Z \end{bmatrix},$$
   where X', Y', and Z' mean signal components detected from the respective sensors, X, Y, and Z mean signal components of the orthogonal coordinate system, and $\theta$ means the angle at which the third sensor is tilted.

4. A sensing method using a hybrid sensor module, the sensing method comprising the steps of:
   detecting signal components sensed from first and second sensors, which are disposed in parallel to a PCB, and a third sensor of which the axial direction is tilted at a predetermined angle $\phi$ from a vertical direction of the PCB in a direction where the second sensor is positioned; and
   correcting signal components detected at the detecting signal components into signal components of an orthogonal coordinate system by using the following equation:
   $$\begin{bmatrix} X' \\ Y' \\ Z' \end{bmatrix} = \begin{bmatrix} 1 & 0 & 0 \\ 0 & \cos\phi & \sin\phi \\ 0 & -\sin\phi & \cos\phi \end{bmatrix} \begin{bmatrix} X \\ Y \\ Z \end{bmatrix},$$
   where X', Y', and Z' mean signal components detected from the respective sensors, X, Y, and Z mean signal components of the orthogonal coordinate system, and $\phi$ means the angle at which the third sensor is tilted.

* * * * *